United States Patent [19]
Botti

[11] Patent Number: 4,956,616
[45] Date of Patent: Sep. 11, 1990

[54] MUTING CIRCUIT FOR AUDIO AMPLIFIERS

[75] Inventor: Edoardo Botti, Mortara, Italy

[73] Assignee: SGS-Thomson Microelectronics S.r.l. Jacobacci-Casetta & Perani, Milan, Italy

[21] Appl. No.: 359,363

[22] Filed: May 31, 1989

[30] Foreign Application Priority Data

Jun. 2, 1988 [IT] Italy ................... 20848 A/88

[51] Int. Cl.⁵ .................................... H03F 1/26
[52] U.S. Cl. ........................... 330/297; 330/149
[58] Field of Search ............. 330/51, 124 D, 124 R, 330/127, 149, 295, 297; 455/174, 194

[56] References Cited

U.S. PATENT DOCUMENTS 4,329,657 5/1982 Kaniya ................. 330/297

FOREIGN PATENT DOCUMENTS 0038731 3/1980 Japan ..................... 455/194

Primary Examiner—Steven Mottola
Attorney, Agent, or Firm—Rosen, Dainow & Jacobs

[57] ABSTRACT

A muting circuit for audio amplifiers having first and second input stages, being supplied a supply voltage via a source, with respective outputs connected in parallel with each other to the input of an output stage and having a signal input applied to the second stage, comprises means of switching over the power supply between the first and the second stages operatively linked to the comparator means effective to compare the values of a reference voltage, associated with the pattern of the supply voltage with a predetermined time delay, to respective predetermined voltage values below the supply voltage.

11 Claims, 3 Drawing Sheets

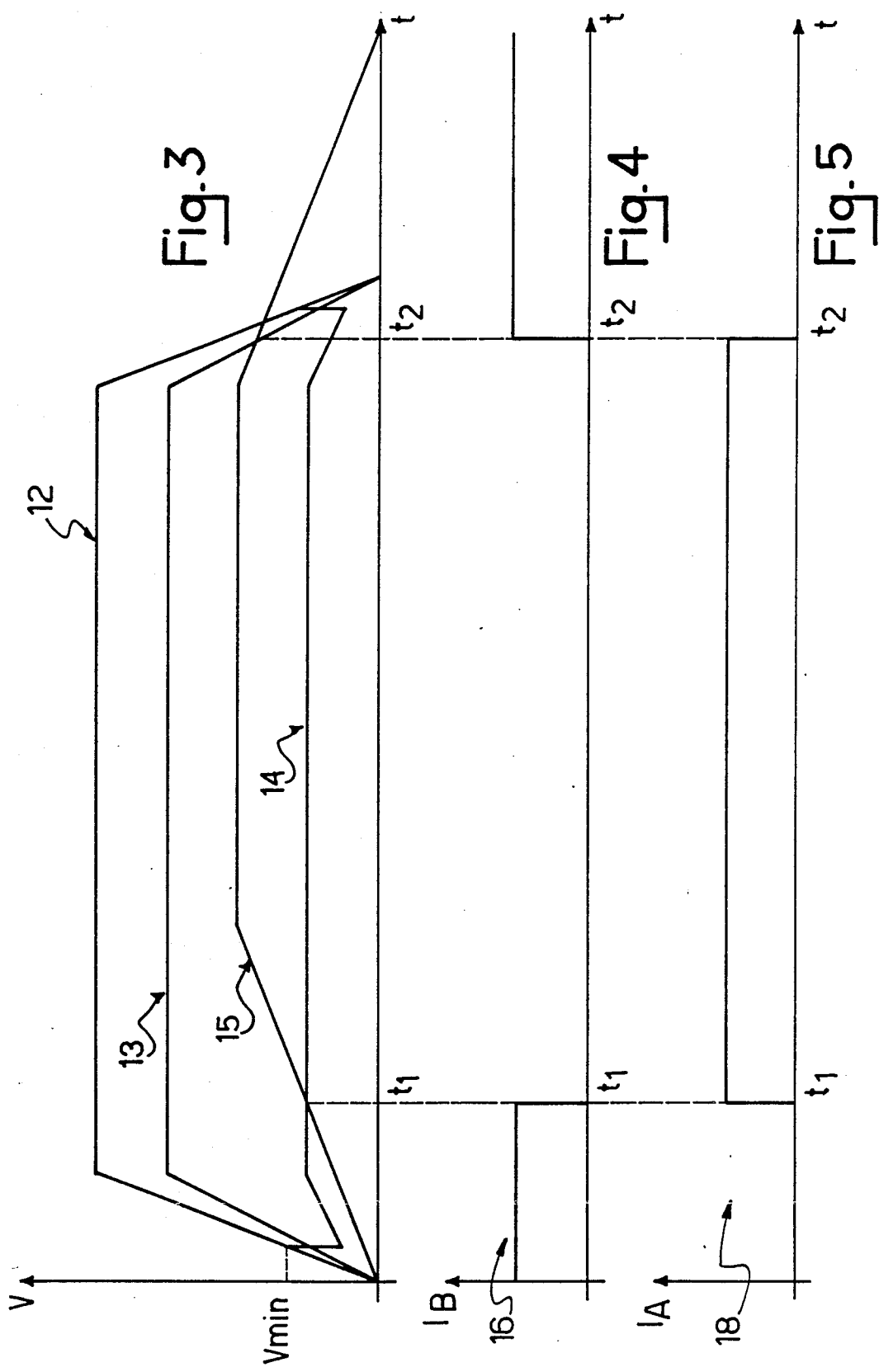

MUTING CIRCUIT FOR AUDIO AMPLIFIERS

This invention relates to a muting circuit for audio amplifiers having first and second input stages, being supplied a supply voltage through a current source, with respective outputs connected in parallel with each other to the input of an output stage and having a signal input applied to the second stage.

As is known, with audio amplifiers, and particularly power audio amplifiers, it is preferable for the signals which appear at the input not to be passed to the output during the period immediately following the amplifier turning on. During that period, in fact, spurious signals are usually present at the input which originate from apparatus upstream of the amplifier and generate noise in the loudspeaker connected downstream from the amplifier.

We will use the term "mute" and its derivatives hereinafter to denote a muted operational state in which the amplifier, while being kept alive, outputs none of the signals which appear at the input.

In many circumstances, there exists a need to have the amplifier in a muted state even prior to its being turned off, or as the amplifier supply voltage Vc drops below a predetermined minimum value Vmin. The last-named ability would be specially welcome in car radio applications to suppress audio emission noise.

The prior art currently provides muting circuits which, while being in several ways advantageous, are only able to bring the amplifier to a muted state with the amplifier on.

The technical problem that underlies this invention is to provide a muting circuit for audio amplifiers which has such design and performance characteristics as to meet the demands specified above, while overcoming the limitations of the prior art circuits.

This problem is solved by a circuit as indicated being characterized in that it comprises a means of switching over the power supply between the first and second stages operatively linked to a comparator means effective to compare the values of a reference voltage, associated with the supply voltage pattern with a predetermined delay, to respective predetermined lower voltage values than the supply voltage.

The features and advantages of the muting circuit according to the invention will become apparent from the following detailed description of an exemplary embodiment thereof, given by way of illustration and not of limitation with reference to the accompanying drawings.

In the drawings:

FIGS. 3 to 5 show in respective graphic forms the values versus time of voltages and currents present in the circuit according to the invention.

Figure 1:
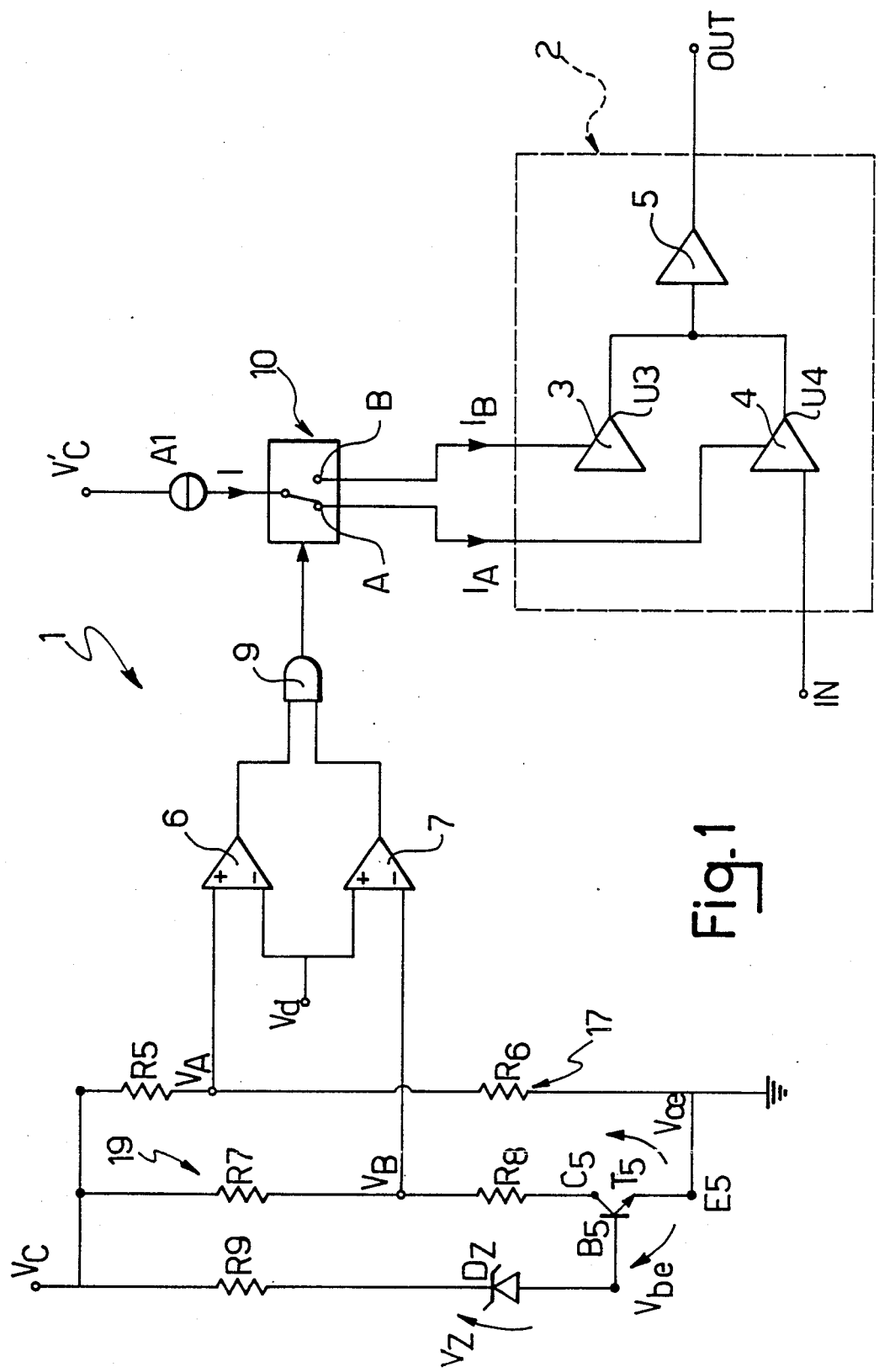
FIG. 1 is a schematic block diagram of the muting circuit according to the invention.

With reference to the drawing views, generally and schematically indicated at 1 is a muting circuit for an audio amplifier 2.

The amplifier 2 comprises first 3 and second 4 input stages having their respective outputs parallel connected to the input of an output stage 5. The output OUT of that stage 5 is intended for connection to an external loudspeaker, not shown because conventional.

The amplifier 2 has a signal input IN applied directly to the second stage 4.

A supply pole Vc' is provided for the amplifier 2; that pole Vc' is connected to the input stages 3 and 4 via a current source A1 and a switch-over means 10. The latter comprises a change-over switch having a movable contact between two fixed terminals A and B, respectively, each connected to a corresponding stage, 4 and 3.

The means 10 is operatively linked to the output of a logic gate 9 of the AND type having two inputs, each connected to a respective output of a voltage comparator.

In particular, indicated at 6 and 7 are two voltage comparators having their respective inverting and non-inverting inputs connected to a reference voltage pole Vd. The voltage Vd follows with a predetermined delay the pattern of a supply voltage Vc to the circuit 1, as explained hereinafter.

The reference voltage Vd is derived, for example, from a positive supply pole Vc (see also FIG. 2) via a resistive divider 8 which comprises a resistor pair, Rd1 and Rd2, connected serially to each other between that pole Vc and ground. A capacitor C is connected between the center tap of the divider 8 and ground to provide, in combination with the resistor Rd2, a parallel RC circuit 11 to permit of the voltage Vd tapping off the divider center.

The circuit 1 further comprises a first voltage divider 17 formed of a pair of serially interconnected resistors R5 and R6 between the positive pole Vc and ground. The non-inverting input of the comparator 6 is connected between such resistors R5 and R6 for supply with a voltage Va.

A second divider 19, comprising a second pair of resistors R7 and R8 interconnected in series, is connected between the pole Vc and the collector C5 of an npn-type transistor T5 having the emitter E5 grounded. Between such resistors R7 and R8, the inverting input of the second comparator 7 is connected for supply with a voltage Vb.

The base B5 of the transistor T5 is connected to the pole Vc via the series connection of a Zener diode Dz and a resistor R9. Under operational conditions, across the diode Dz there occurs a voltage drop Vz, while a voltage drop Vbe of 0.7 Volts occurs between the base B5 and the emitter E5 of the transistor T5.

Figure 2:
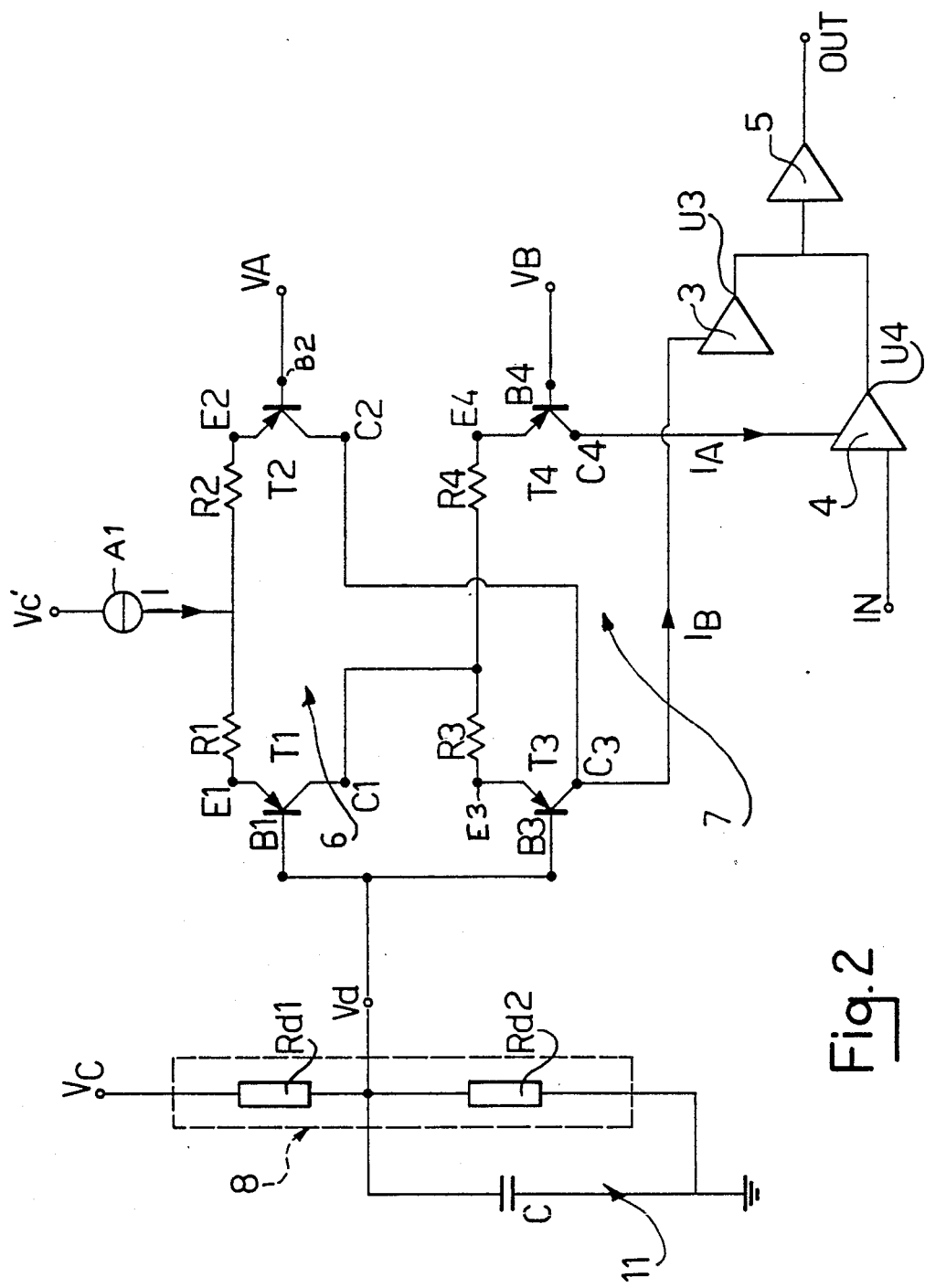
FIG. 2 is a diagram illustrating in schematic form a detail of the circuit shown in FIG. 1.

With specific reference to the example shown in FIG. 2, the structure of the circuit 1 will be now described in greater detail. The comparator 6 comprises a pair of transistors T1 and T2 of the pnp type which have respective emitters E1 and E2 connected to each other, via corresponding resistors R1 and R2, and to the source A1 of current I.

The base B1 of the transistor T1 is connected to the reference voltage pole Vd, and the base B2 of the other transistor is connected to the voltage pole Va.

Likewise, the second comparator 7 comprises a transistor pair, T3 and T4, of the pnp type having their emitters E3 and E4 connected to each other, via respective resistors R3 and R4, and to the collector C1 of the transistor T1.

The resistors R1, R2, R3 and R4 perform the sole function of restricting the flow of current from one transistor to another in each comparator.

The base B3 of the transistor T3 is connected to the pole Vd, while the base B4 of the other transistor, T4, is connected to the voltage pole Vb.

The collector C3 of the transistor T3 is connected directly to supply a current Ib to the first stage 3 of the amplifier 2. Also connected to that collector C3, and hence to the stage 3, is the collector C2 of the transistor T2 incorporated to the first comparator 6.

The collector C4 of the transistor T4 is instead connected to the second stage 4 of the amplifier 2 to supply it with a current Ia.

Now, while making specific reference to FIG. 3, the pattern is shown for various voltages of the circuit 1. Indicated at 12 is a graph of the supply voltage Vc, which rises from zero to the steady state value, and vice versa.

On the voltage Vc exceeding a minimum value Vmin given by the sum of the breakdown voltage Vz of the Zener diode Dz plus the voltage drop Vbe between the base B5 and the emitter E5 of the transistor T5, this transistor will be conducting.

If the values of the resistors R7 and R8 are sufficiently high, the voltage drop Vce between the collector and the emitter of the transistor T5 will be almost nil. By suitably selecting the values for the resistors R5, R6 and R7, R8, the value of the voltage Va, whose pattern is illustrated by the graph 13, is made larger than the value of the voltage Vb, illustrated by the graph 14.

The reference voltage Vd will follow with a predetermined delay, as illustrated by the graph 15, the pattern of the supply voltage Vc, to attain a steady state condition at a value which is lower than Va but higher than Vb.

Shown in FIGS. 4 and 5 are the graphs 16 and 18 which illustrate versus time the patterns of the values of the currents Ib and Ia flowing to the inputs of the stages 3 and 4, respectively, of the amplifier 2. Indicated at t1 and t2 are the times when a change from the off to the on state, and vice versa, of the amplifier 2 takes place.

The operation of the inventive circuit will be now described.

The current I from the source A1 is supplied, via the comparators 6 and 7, to the corresponding input stage 3 and 4, of the amplifier 2.

As the circuit 1 is turned on, the current I will flow through the transistors T1 and T3 to power the first stage 3 until (t1), while the voltage Vd is held below the voltage value Vb. In this situation, the transistors T2 and T4 will not be conducting and the second stage 4 is off, thereby the signal applied to the input IN of the amplifier 2 will not be passed to the output OUT. Accordingly, the amplifier will be in a mute condition.

On the voltage Vd exceeding the value Vb, at the time t1, the transistor T3 goes off and the transistor T4 on. The current I, now flowing through the transistors T1 and T4, will power the second stage 4, thereby the amplifier 2 is allowed to operate in its normal mode.

On turning off (t2), the voltage Va will become lower than the voltage Vd and turn off the transistor T1 and enable the transistor T2 to become conductive to directly power the first stage 3 and restore the amplifier to its muted state.

Thus, the circuit of this invention enables the amplifier to be muted over respective predetermined time periods, one immediately after turning on and the other preceding turning off.

Furthermore, in all those cases when the supply voltage Vc drops or remains below the minimum value Vmin=Vz+Vbe, the transistor T5 will be non-conductive and on the base B4 of the transistor T4 there will be such a voltage value as to hold this transistor also non-conductive. In such situations, the amplifier 2 will be in a muted condition, thereby the circuit of this invention attains the added objective of muting the audio amplifier even in those instances when the supply voltage is lower than a predetermined minimum value.

The circuit according to this invention solves, therefore, the technical problem in a simple and effective way with reduced circuit components.

I claim:

1. An audio amplifier circuit comprising first and second input stages having parallel-connected outputs, and output stage having an input connected to the parallel-connected outputs of the first and second stages and an output, said second input stage having an input, means for connecting a signal to the second stage input, a supply voltage and a current source connected in series, switching means connecting the current source to each of the first and second stages, comparator means connected to the switching means, a reference voltage connected to the comparator means, means for connecting the supply voltage with a time delay to the comparator means, said comparator means being operative to switch the switching means between the first and second stages in response to a comparison of the reference voltage to predetermined voltage values lower than that of the supply voltage.

2. A circuit according to claim 1, further comprising a logic AND gate having inputs and an output connected to the switching means, said comparator means comprising first and second voltage comparators having respective outputs connected to respective inputs of said logic AND gate.

3. A circuit according to claim 1, wherein the comparator means comprises first and second voltage comparators, first and second resistive dividers connected between the supply voltage and ground, said reference voltage being derived from between said first and second resistive dividers, said voltage comparators each having a respective input pair of which one is connected to the center tap of a corresponding divider and the other of which is connected to said reference voltage.

4. A circuit according to claim 1, further comprising a resistive voltage divider connected between the supply voltage and ground, and a capacitor connected in parallel to a resistor of said divider to provide a delay circuit, said reference voltage being derived from the center tap of said divider.

5. A circuit according to claim 2 wherein each voltage comparator comprises a pair of transistors having their emitters connected to each other and to said supply voltage, with the collector of one of the transistors connected directly to one of the input stages.

6. A circuit according to claim 3, further comprising a transistor having its emitter and collector connected between a second divider and ground, and having its base connected to the supply voltage via a series connected Zener diode and resistor.

7. A muting circuit for an audio amplifier having first and second input stages connected in parallel to an output stage, a supply voltage source for powering the first and second stages, and an audio signal to be amplified connected only to the second input stage, said muting circuit comprising means for selectively switching the supply voltage to the first stage upon the supply voltage source being turned ON and before its voltage value has risen to a first predetermined level thereby muting the audio amplifier and for selectively switching the supply voltage to the second stage after the supply voltage has risen above said predetermined level to activate the audio amplifier.

8. The muting circuit of claim 7, wherein said muting circuit further comprises means for switching the supply voltage to the first stage upon the supply voltage source being turned OFF and its voltage value falling below a second predetermined level.

9. The muting circuit of claim 8, wherein said muting circuit further comprises means for switching the supply voltage source to the first stage whenever the supply voltage value falls below a minimum value greater than zero.

10. The muting circuit of claim 8, wherein said muting circuit means comprises means for generating first, second and third voltage values from the supply voltage source, said first voltage value determining said first predetermined level, said second voltage value determining said second predetermined level, said third voltage value being a reference value, comparator means connected to receive as inputs the first, second and third voltage values and being operative when said third value exceeds the first value to switch the supply voltage to the second stage and when said second value falls below the third value to switch the supply voltage to the first stage.

11. The circuit of claim 10, further comprising a delay circuit, said third voltage value being derived from said delay circuit.

* * * * *

UNITED STATES PATENT AND TRADEMARK OFFICE
CERTIFICATE OF CORRECTION

PATENT NO. : 4,956,616

DATED : September 11, 1990

INVENTOR(S) : EDOARDO BOTTI

It is certified that error appears in the above-identified patent and that said Letters Patent is hereby corrected as shown below:

Title page item no. [73] "Assignee":

Please change "SGS-Thomson Microelectronics S.rl. Jacobacci-Casetta & Perani, Milan, Italy" to --SGS-THOMSON MICROELECTRONICS S.r.l., Milan, Italy--

Signed and Sealed this

Thirty-first Day of March, 1992

*Attest:*

HARRY F. MANBECK, JR.

*Attesting Officer*  *Commissioner of Patents and Trademarks*